United States Patent

Laig-Horstebrock et al.

[11] Patent Number: 6,163,133
[45] Date of Patent: Dec. 19, 2000

[54] PROCESS FOR DETERMINING THE STATE OF CHARGE AND THE PEAK CURRENT LOADABILITY OF BATTERIES

[75] Inventors: Helmut Laig-Horstebrock, Frankfurt; Eberhard Meissner, Hofheim; Dieter Ubermeier, Hannover; Karsten Michels, Braunschweig; Uwe Dierker, Isenbuttel, all of Germany

[73] Assignees: V B Autobatterie GmbH; Volkswagen AG, both of Hannover, Germany

[21] Appl. No.: 09/417,650

[22] Filed: Oct. 14, 1999

[30] Foreign Application Priority Data

Oct. 15, 1998 [DE] Germany ............. 198 47 648

[51] Int. Cl.$^7$ .................................................. H02J 7/00
[52] U.S. Cl. ........................................ 320/132; 320/130
[58] Field of Search ........................ 320/132, 130, 320/149, DIG. 21; 324/432, 433, 430

[56] References Cited

U.S. PATENT DOCUMENTS

| | | | |
|---|---|---|---|
| 5,808,445 | 9/1998 | Aylor et al. | 320/132 |
| 5,998,969 | 12/1999 | Tsuji et al. | 320/132 |

FOREIGN PATENT DOCUMENTS

| | | |
|---|---|---|
| 22 42 510 | 8/1972 | Germany . |
| 39 01 680 C2 | 1/1989 | Germany . |
| 40 07 883 A1 | 3/1990 | Germany . |
| 43 39 568 A1 | 11/1993 | Germany . |
| 195 43 874 A1 | 11/1995 | Germany . |

*Primary Examiner*—Peter S. Wong
*Assistant Examiner*—Lawrence Luk
*Attorney, Agent, or Firm*—Schnader Harrison Segal & Lewis LLP

[57] ABSTRACT

In a process for determining the state of charge and the peak current loadability of batteries in the currentless pauses before and after a loading phase the no-load voltages $U_{01}$ and $U_{02}$ are measured. From them, with allowance for battery-specific parameters, especially the time curve of the no-load voltage, the true battery rest voltages $U_{001}$ and $U_{002}$ are computed. During the loading phase the converted current quantity q is measured and from the relationship $U_{002} - U_{001} = C_1 \cdot q/Q_0$ the acid capacity $Q_0$ of the battery is found. The relative state of charge $SOC_1$ is determined from a curve of the rest voltage $U_{00}$ linearized by the formula $SOC_1 = U_{002}/C_1 - C_2$ as a function of the state of charge of the battery from which the absolute state of charge is calculated as $SOC_1 \cdot Q_0$.

From the internal resistance $R_1$, a preassigned temperature and the last determined state of charge, a rest voltage is predicted for a later time from which, with the current necessary for starting the engine known, a pronouncement can be derived concerning the starting capacity of the battery.

8 Claims, No Drawings

PROCESS FOR DETERMINING THE STATE OF CHARGE AND THE PEAK CURRENT LOADABILITY OF BATTERIES

FIELD OF THE INVENTION

This invention relates to a process for determining the state of charge and peak current loadability of batteries.

BACKGROUND OF THE INVENTION

For the user of batteries it is of particular importance to know the state of charge and peak current loadability of the batteries. For example, for the ability of a battery to start a motor vehicle with an internal combustion engine the state of charge and the state of aging or the characteristic capacity loss of the battery are critical since the current intensity that can be taken off the battery and its power delivery are limited. Of particular importance is the determination of the state of charge or the starting capability of a battery in those cases in which, for example, intermittent motor operation occurs. This is important because, during times when the motor is not running, the on-board power system or the vehicle, with its various power consumers, continues to operate even though the generator is not producing any current. Monitoring the state of charge and starting capability of the battery in such cases assures that the energy content of the battery is sufficient to start the engine.

Various procedures are known for measuring the state of charge of batteries. In many cases integrating measurement devices are used (Ah counters), in which case the charging current, if necessary with involvement of a fixed charging factor, is considered. Since the useful capacity of a battery is strongly dependent on the magnitude of the discharge current and temperature, no satisfactory pronouncement concerning the useful capacity that can still be taken from the battery can be made with such procedures.

From DE-PS 2242510, for example, it is known in a process for measuring the state of charge that the charging current can be adjusted with a factor depending on the temperature and the state of charge of the battery itself.

DE-OS 4007883 describes a process in which the starting capacity of a battery is found by measuring battery voltage and battery temperature and comparison with a state of charge family of curves valid for the type of battery being tested.

DE-OS 19543874 discloses a calculation process for the discharge characteristic and residual capacity of a battery in which the current, voltage and temperature are measured, wherein the discharge characteristic is approximated by a mathematical function with a curved surface.

DE-PS 3901680 describes a process for monitoring the cold starting capability of a battery in which the battery is temporarily loaded with a resistance, the voltage drop at the resistance is measured and from this by comparison with anticipated values it is determined whether the cold starting capability of the battery is still sufficient. In this case, the starting process is used to load the battery.

Finally, DE-OS 4339568 discloses a process for determining the state of charge of a motor vehicle battery in which the battery current and rest voltage are measured and from these parameters the state of charge is determined, in which case the battery temperature is also considered. In this case, the charging currents are measured during different time intervals and compared with each other and from this the residual capacity is found.

By known procedures it is not directly possible to make a statement of sufficient accuracy regarding the state of charge of a battery. In addition, many of known procedures are costly and cannot always be used directly in the motor vehicle.

OBJECTS OF THE INVENTION

The invention has an objective of devising a process for determining the state of charge and starting capacity of a battery for motor vehicles which has adequate practical accuracy and is also so simple that the battery state recognition system has "learned" selected fixed parameters of the functional dependencies after a short time and is capable of rendering of practical operating parameters predictions.

SUMMARY OF THE INVENTION

A process for determining the state of charge and peak current loadability of batteries including the steps of measuring no-load voltages $U_{01}$ and $U_{02}$ in currentless pauses before and after a load phase; calculating true battery rest voltages $U_{002}$ and $U_{002}$ from the no-load voltages $U_{01}$ and $U_{02}$ for battery specific parameters, including the time curve of the no-load voltage; measuring converted current quantity q from the formula $U_{002}-U_{001}=C_1 \cdot q/Q_0$ during a loading phase; determining the acid capacity $Q_0$ of the battery; determining the relative state of charge $SOC_1$ from a curve of the rest voltage $U_{00}$ linearized by the formula $SOC_1 = U_{002}/C_1 - C_2$ as a function of the state of charge of the battery; and calculating the absolute state of charge as $SOC_1 \cdot Q_0$.

DETAILED DESCRIPTION OF THE INVENTION

It will be appreciated that the following description is intended to refer to specific embodiments of the invention and is not intended to define or limit the invention, other than in the appended claims.

The relationship between the state of charge SOC and the rest voltage $U_{00}$ allows for the fact that the rest voltage in the case of small states of charge increases with SOC in a nonlinear manner but passes over into an almost linear curve in the higher charge state range relevant for practice. Therefore, one uses for SOC a linear adaptation to the rest voltage/charge state dependence in the SOC range between about 0.2 and 1 of the form $SOC = U_{00}/C_1 - C_2$ wherein $C_1$ is about 1.5 V and $C_2$ is about 7.5 (for 6-cell lead-acid batteries).

By the process according to the invention, in current-free pauses before or after a loading phase, a measurement of the no-load voltage $U_0$ of the battery is performed. From this, with allowance for battery-specific parameters, but especially the time curve of the idle voltage $U_0$, the true rest voltage $U_{00}$ of the battery is calculated. During the loading phase, the converted current quantity q is measured and from the quotient of the difference of the rest voltages thus calculated and the charge conversion the so called acid capacity $Q_0$ of the battery is found, i.e. the change in the state of charge of the battery is registered. This is calculated with the following relationship:

$$U_{002} - U_{001} = C_1 \cdot q/Q_0$$

wherein $C_1$ is a magnitude determined empirically from the system properties of the lead-acid battery. Its value for conventional starter batteries is about 1.5 V (6-cell battery). The acid capacity $Q_0$ is the quantity of electricity expressed in electrical equivalents which is stored in the sulfuric acid in the battery. The current quantity q converted during the loading phase is determined by integrating measurement of the battery current i. The voltage measurement in the rest periods of the battery is performed preferably at preassigned time intervals. The time intervals in this case are chosen such that a constant or periodic monitoring of the battery takes place, e.g. the measurement can be made in intervals of one minute.

It is advisable to standardize all measured data to a preassigned temperature of, for example, 25° C. In the calculation of the real rest voltage $U_{00}$ from the measured idle voltages, the voltage level, the time curve of the battery voltage and the duration of previous rest breaks are allowed for. The true rest voltage is determined from two rest voltages measured successively in a rest period. In order to obtain satisfactory results in this calculation the first voltage value used should be measured after a minimum time of about 2 hours and the second voltage value should be measured after another pause of about 2 hours.

In order to be able to make determinations concerning the state of the battery, especially in order to predict if necessary future starting capacity exists, the internal resistance $R_1$ of the battery is determined by a peak current load, e.g., the starting process. From the internal resistance found in the previously calculated battery data a prediction can be derived for the future starting capacity of the battery.

During the battery rest pause, a measurement of the no-load voltage $U_0$ of the battery is performed. For the evaluation of the no-load voltage advisably a minimum rest time is maintained which lies in the range of about 4 hours. The rest time in this case means a time in which the current is less than about 0.1 A for a 12V/50 Ah battery. As soon as greater currents are flowing the pause begins again after the end of these loads.

In those cases when $U_0$ is greater than about 13.2 V after more than about 1 hour (6-cell battery), no further measurement need be made since it may be assumed that a full state of charge is present. If the rest pause is between about 4 and 8 hours and the rest voltage drops at this time, one obtains the true rest voltage $U_{00}$ from the following relationship:

$$U_{00}=U_0(4h)-a(U_0(2h)-U_0(4h))$$

wherein a=2.5–3.5 when T=25° C.; and
a=15–20 when T=−18° C.

In the general form, $U_{00}$ can be determined from $U_0$ according to the following relationship:

$$U_{00}=U_0(t)+((a+2)-\ln(t)/\ln(2))(U_0(t)-U_0(t/2))$$

(wherein t is the time in hours)

If it is desired to increase the accuracy further then one can also introduce a $U_0(t)$ function for a.

If during the rest pause the rest voltage $U_0$ increases, the rest voltage adjustment is generally completed after about 4 h, i.e.:

$$U_{00}=U_0(t>4h)$$

Since the determination of the true rest voltage $U_{00}$ from a discharge of the battery is generally much more accurate than the measurement based on a previous charge, the calculated value of the true rest voltage can be scored with a weighting factor which is higher for discharging than for charging.

It is advantageous to standardize the measured voltage values to a certain temperature, e.g. 25° C. This standardization is performed according to the formula:

$$U_{00}(25° C.)=U_0(T)-(T-25° C.)\cdot b$$

The factor b=≈0.0014 V/degree is valid for a 6-cell lead starter battery. It is to be increased or decreased proportionally with increasing numbers of cells.

The no-load voltage $U_{00}$ calculated from the last measurement in each case is a measure of the relative state of charge of the battery wherein:

$$SOC=U_{00}(25° C.)/C_1-C_2$$

From two rest voltages thus determined and the quantity of electricity taken from or introduced into the battery in the intermediate time $q=\int i dt$, the acid capacity $Q_0$ of the battery can be estimated. This acid capacity is obtained according to $$Q_0=C_1\cdot q/(U_{002}-U_{001})$$

from the measured values, it is the capacity equivalent of the quantity of theoretically convertible sulfuric acid in the lead battery during the discharge in the case of nonlimitation by the battery electrode. The value of $C_1$ is about 1.5 V and the value of $C_2$ is about 7.5 for a 6-cell battery.

The absolute state of charge of the battery in ampere seconds at this time is obtained from $SOC \cdot Q_0$.

In order to be able to make additional predictions from the previously determined values concerning the starting capacity of the battery at a later time, the internal resistance $R_i$ of the battery should additionally be measured.

The internal resistance of the battery is obtained by measuring the voltage and current at a high load. For this purpose in particular a voltage and current measurement during a starting process is used.

For example, from $R_1$ we obtain:

$$R_1=(U_{load}-U_0)/(I_{load}-I_0)$$

wherein $U_0$ is the last measured rest voltage and $I_0$ is the last measured base current caused by other users such as vehicle lighting etc.

The curve of the internal resistance of the starter battery as a function of the state of charge is practically constant for charge states of more than 50% but increases strongly in the case of a low charge state. In order to allow for this curve in determining the starting capacity of the battery, the internal resistance $R_1$ is composed of two parts, one part $R_1$ which is almost independent of the state of charge and only dependent on temperature and a component $R_2$ which varies strongly with SOC for SOC<0.5.

$$R_1=R_1(T)+R_2(SOC)$$

If the state of charge is greater than about 50% the determination of $R_1$ is made from $$R_1=R_i$$

If the state of charge is less than about 50% the determination of $R_2$ is performed $$R_2=R_i-R_1$$

For $R_2$ the form $R_2=\exp(-b(SOC-SOC_{gr}))$ has proven of value when b≈21. $SOC_{gr}$ is determined from this.

For example, if the determination of the state of charge is to be begun with a new battery, then first an assumption must be made concerning the capacity of the starter battery, e.g. 60 Ah and via the limiting $SOC_{gr}$, e.g. 0.2 and concerning the internal resistance (e.g. 14 mW). From the initial rest voltage $U_{00}$ the state of charge is calculated as explained above.

From the first starting process the internal resistance $R_1$ and the state of charge SOC are found. These values, if they are to be determined again at a later time, are not fully adopted but, rather, the last value is corrected depending on the quality of the new measurement. The greater the capacity quantity charged in or taken off between pauses is, the more accurately the acid capacity can be determined and the more the new value can be fully adopted. It is advisable to accept the newly determined internal resistance as fixed, e.g. with about 10% of the deviation. If the evaluation of the true rest voltage yields a higher value for the state of charge then a calculation from the sum of the old state-of-charge determination of the measured change in state of charge, for safety and for reasons of plausibility one does not accept the full SOC value calculated from $U_{00}$ but, rather, a corrected value.

From the relationships according to the invention a prediction can be made concerning the restarting capacity of a battery, e.g. after a long rest pause. This makes sense, for example, if the vehicle is shut down in the evening in winter and it has to be determined at a correspondingly low outside temperature whether the battery is still capable of reliably starting the vehicle the next morning with a possibly different outside temperature.

To solve this prediction problem one forms $$T_m = \text{Min}(T_{min} - 10° C.)$$

from the minimum outside temperatures of the past three days. The additional depression by another 10° C. is a safety factor and can be modified depending on the climatic conditions of the location.

From the known last state of charge ($SOC_1$) and the last determined state of charge change $q/Q_0$ a state of charge SOC is formed by $$SOC = SOC_1 + q/Q_0$$

From SOC as mentioned above $U_{00}$ is determined for the assumed temperature.

With this the anticipated rest voltage for the predicted starting process becomes known. From the already explained dependence of the internal resistance R and the state of charge SOC the anticipated internal resistance at the time of starting is calculated.

Based on the assumption of the required starting current $I_{start}$ for a cold engine, one thus obtains a predicted starting voltage $U_{start} = U_{00} - R_1 \times I_{start}$. From this relationship it can be determined whether the starting voltage that is to be expected is greater than a preassigned voltage. If the starting voltage is greater than the preassigned voltage, the next morning the engine can still be started with certainty, but if the voltage is lower then no sufficient security exists and the battery must be charged. With the calculation method it is not only possible to predict the restarting capacity of a battery but also during operation, e.g. in vehicles with Intermittent engine operation, the time for restarting the engine can be determined.

The initial measured values ($U_{00}$, T, I) necessary for the process described can easily be determined in the motor vehicle. These data can also be evaluated by conventional electronic measured value processing systems and modulate the corresponding indicators in the vehicle.

What is claimed is:

1. A process for determining the state of charge and peak current loadability of a battery comprising:

measuring no-load voltages $U_{01}$ and $U_{02}$ in currentless pauses before and after a load phase;

calculating true battery rest voltages $U_{001}$ and $U_{002}$ from said no-load voltages $U_{01}$ and $U_{02}$ for battery specific parameters, including the time curve of the no-load voltage;

measuring the converted current quantity q, wherein q is the amount of capacity discharged during the loading phase;

determining the acid capacity $Q_{10}$ of the battery from the formula $U_{002} - U_{001} = C_1 \cdot q/Q_0$;

determining the relative state of charge $SOC_1$ from a curve of the rest voltage $U_{00}$ linearized by the formula $SOC_1 = U_{002}/C_1 - C_2$ as a function of the state of charge of the battery; and calculating the absolute state of charge as $SOC_1 \cdot Q_0$, wherein $C_1$ is a constant voltage and $C_2$ is a constant, both $C_1$ and $C_2$ depending on the number of cells in the battery.

2. The process of claim 1, wherein the measured rest voltage $U_0$, the voltage status, the time voltage curve and the duration of the rest pause are considered in calculating the true test voltage $U_{00}$.

3. The process of claim 1, wherein the measurement of the rest voltage $U_0$ during rest pauses occurs at fixed preassigned intervals.

4. The process of claim 1, wherein the calculated true rest voltage values $U_{00}$ are standardized by correction factors to a preassigned temperature.

5. The process of claim 1, wherein the true rest voltage $U_{00}$ is determined from measurements of the no-load voltage $U_0$ after a minimum resting time of about two hours.

6. The process of claim 1, wherein internal resistance $R_1$ is determined as a quotient of the differences of the voltages and the current before and during the peak current load.

7. The process of claim 1, wherein a rest voltage is calculated for a later time from which with the current known to be necessary for starting the engine a prediction can be derived concerning the starting capacity of the battery from the internal resistance $R_1$, a preassigned temperature and the last determined state of charge.

8. The process of claim 1, wherein $C_1$ is 1.5 V and $C_2$ is 7.5 for a six-cell battery.

* * * * *